United States Patent [19]

Hertzler et al.

[11] 4,381,486
[45] Apr. 26, 1983

[54] APPARATUS FOR CHECKING FOR ELECTRICAL FRIT BREAKDOWN IN KINESCOPES

[75] Inventors: Merle E. Hertzler, Elverson, Pa.; James S. Stelzer, Marion, Ind.

[73] Assignee: RCA Corporation, New York, N.Y.

[21] Appl. No.: 237,846

[22] Filed: Feb. 24, 1981

[51] Int. Cl.³ .......................................... G01R 31/024
[52] U.S. Cl. ..................................... 324/404; 324/54
[58] Field of Search ..................... 324/404, 158 P, 54; 269/908; 29/25.19, 25.1

[56] References Cited

U.S. PATENT DOCUMENTS

| | | | |
|---|---|---|---|
| 3,045,281 | 7/1962 | Skobel | 324/54 |
| 3,654,548 | 4/1972 | Pecorari et al. | 324/404 |
| 3,943,438 | 3/1976 | Barber et al. | 324/404 |
| 4,329,648 | 5/1982 | Allaroyce et al. | 324/404 |

*Primary Examiner*—Michael J. Tokar
*Assistant Examiner*—Kevin D. O'Shea
*Attorney, Agent, or Firm*—Eugene M. Whitacre; Dennis H. Irlbeck; Lester L. Hallacher

[57] ABSTRACT

An apparatus for checking for electrical frit breakdown in kinescopes includes a support for loosely receiving the kinescope funnel. A floating positioning means closely receives the neck of the kinescope when a kinescope is positioned in the vicinity of the particular location. An orientation mechanism accurately orients the kinescope in the selected orientation and the kinescope is then securely maintained in said location. A fluid-like electrical contact is placed against the outside of the frit seam. A probe having a movable, electrical contact is inserted into the neck of the kinescope and the movable contact brought against the conductive coating on the inside of the envelope. A current flow between the movable contact and the fluid-like contact indicates an electrical frit breakdown.

12 Claims, 6 Drawing Figures

APPARATUS FOR CHECKING FOR ELECTRICAL FRIT BREAKDOWN IN KINESCOPES

BACKGROUND OF THE INVENTION

This invention relates generally to the testing of kinescopes during production and particularly to an apparatus for testing for electrical breakdown of the frit seal of such tubes.

Kinescopes for television include a funnel, a neck and a faceplate panel. Typically the funnel and neck are integrally fabricated with the neck portion attached to the narrow end of the funnel. The faceplate panel is affixed to the wide end of the funnel by a fritting process which hermetically couples the two elements. The inside of the funnel, and a portion of the neck, are coated with a conductive material which is biased with the high positive voltage during the operation of the tube to accelerate the electron beams toward the faceplate panel. A problem sometimes arises when the frit seal is made electrically conductive by the diffusion of the electrical coating material into the fritting material or by other contaminants or pin holes in the frit seal. Any of these conditions make the tube unacceptable. Every kinescope therefore must be checked for an electrically conductive frit prior to further processing.

The instant invention addresses this problem by the provision of an apparatus for automatically checking kinescopes for electrical breakdown of the frit seal.

SUMMARY OF THE INVENTION

An apparatus for checking for electrical breakdown of the frit seal of the kinescope includes a support for loosely positioning the kinescope in the general vicinity of a particular location. A floating positioning means closely receives the neck of the kinescope. The kinescope is positioned at the desired location and securely maintained in said location. A drape-like electrical contact is moved against a substantial portion of the frit seam to establish electrical continuity. A probe is inserted into the neck and a movable contact is brought into contact with the conductive coating inside the kinescope.

DETAILED DESCRIPTION OF THE PREFERRED EMBODIMENT

Figure 1:
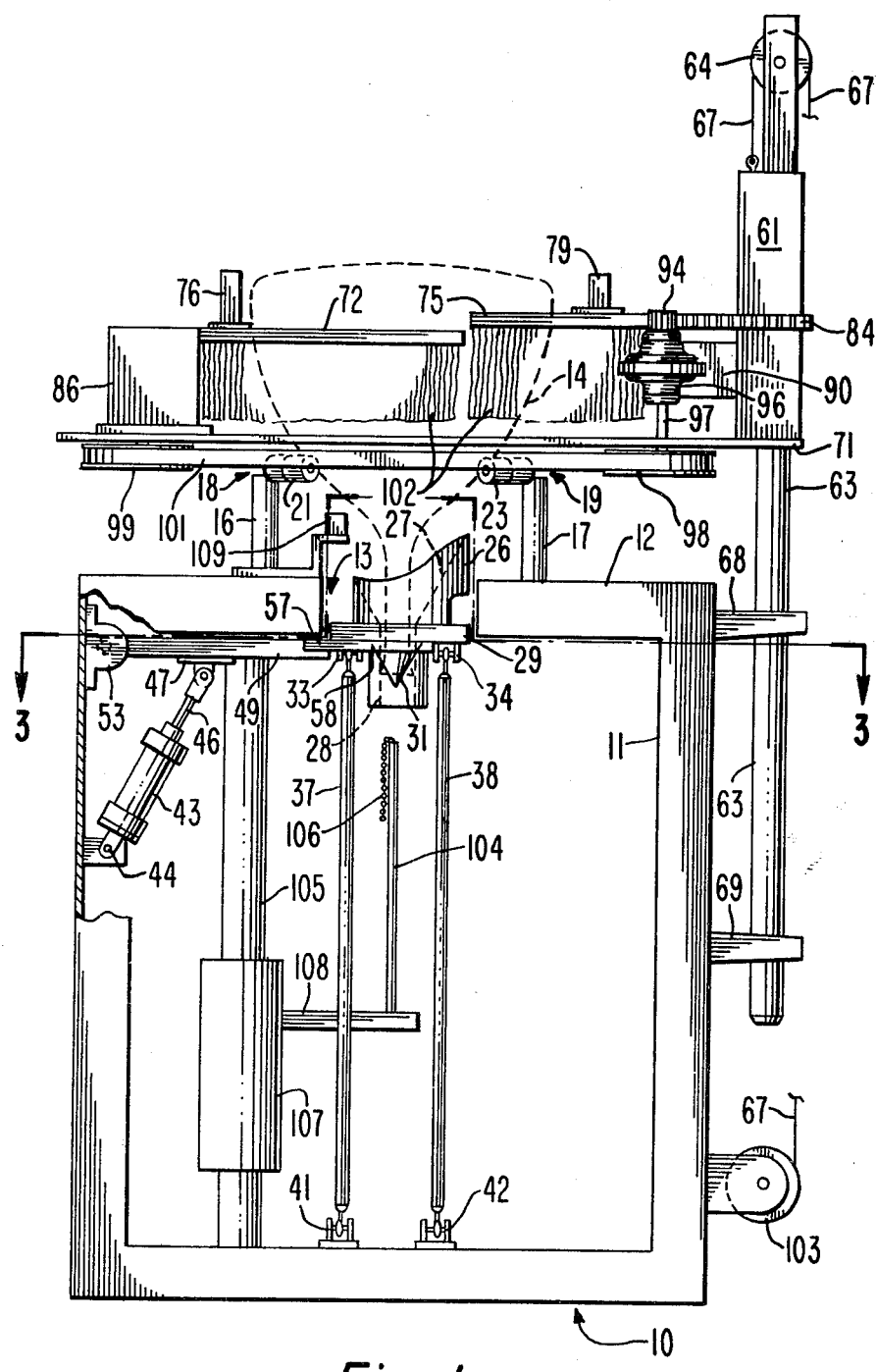
FIG. 1 is a side view of a preferred embodiment of a frit checking apparatus.
Figure 2:
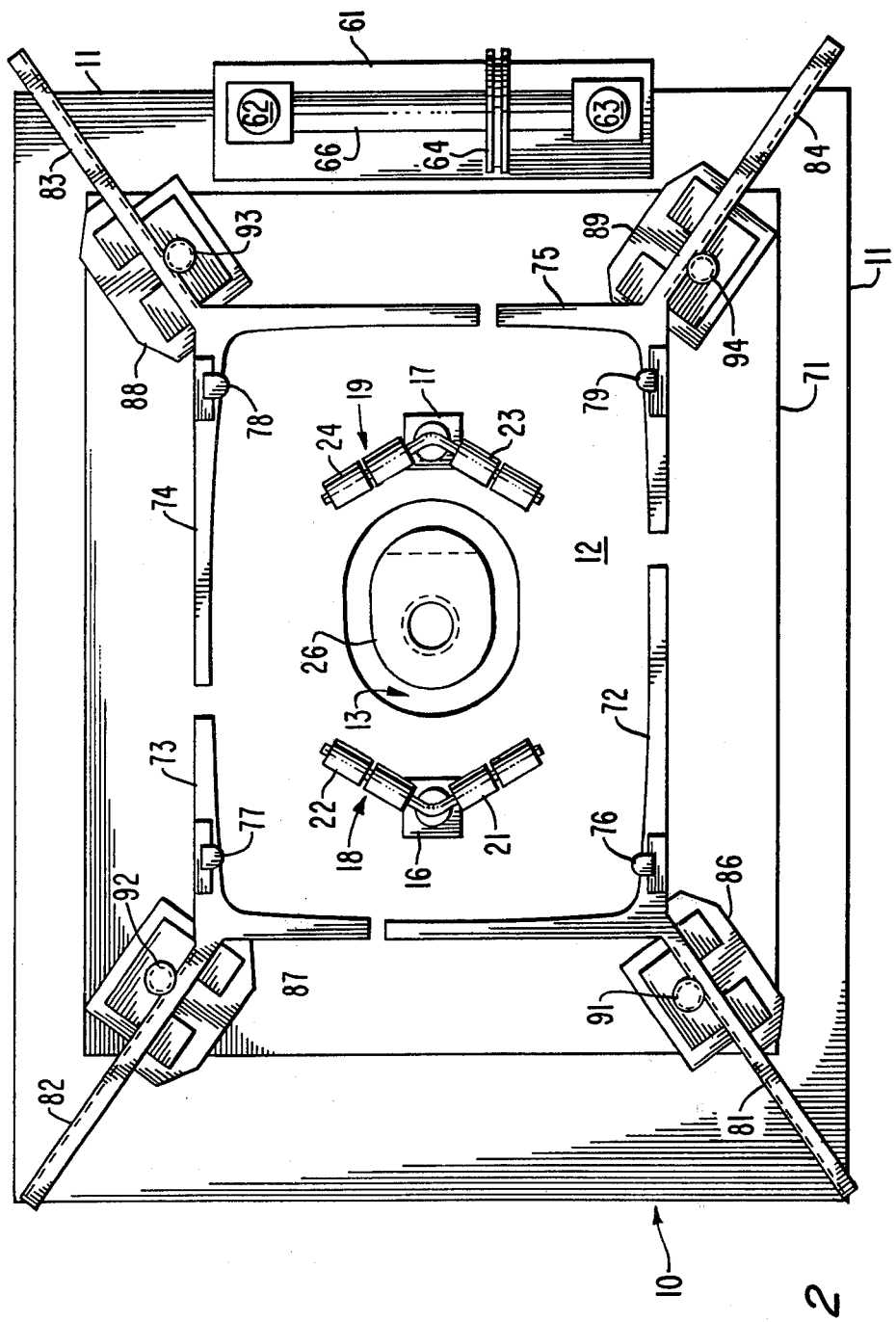
FIG. 2 is a top view of the frit checking apparatus of FIG. 1.

As shown in FIGS. 1 and 2, a frit checking apparatus 10 includes a stationary frame 11, the top surface 12 of which contains an aperture 13. A kinescope 14, shown in phantom lines, is supported above the top surface 12 so that the neck of the kinescope extends through the aperture 13. Two vertical columns 16 and 17, are fixed to the top surface 12 and serve as mounts for two supports 18 and 19 which loosely support the kinescope 14 in the vicinity of a particular location within the apparatus. Preferably, in the preferred embodiment the particular location is the center of the apparatus.

As shown in FIG. 2, the support 18 includes two angularly disposed cylindrical rests 21 and 22. The rests 21 and 22 are fabricated from a firm but resilient material which will not damage the kinescope. The support 19 is similarly constructed with two angularly disposed cylindrical rests 23 and 24. The spacing between the columns 16 and 17 and the lengths of the cylindrical rests 21, 22, 23, and 24 are selected so that kinescopes of any size are loosely received by the rests and the necks of the kinescopes are positioned in the general vicinity of the center of the apparatus. The angular disposition of the rests 21-22 and 23-24 causes the funnel portion of the kinescope to be centered in the apparatus with a reasonable degree of accuracy.

Figure 3:
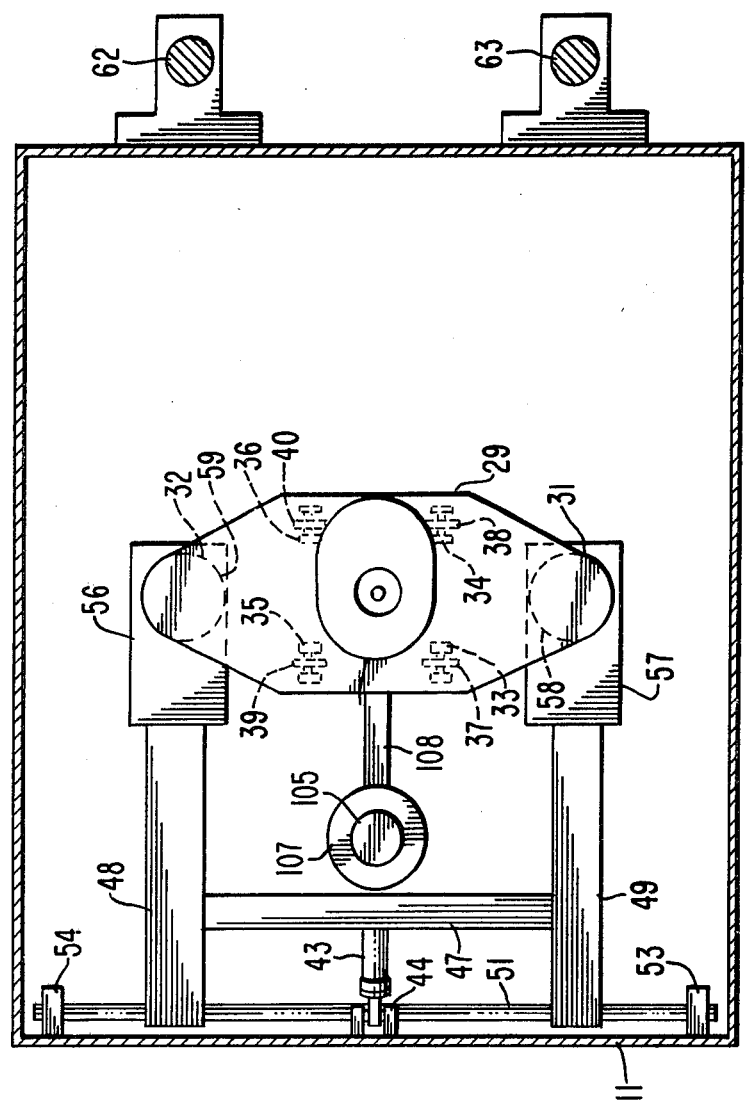
FIG. 3 is a view taken along line 3—3 of FIG. 1.

A floating positioner 26 is arranged in the aperture 13. The positioner 26 is made from a formable material which is somewhat resilient so that the necks of the kinescopes are not broken upon contact with the positioner. The positioner 26 contains a coaxial bore the input portion 27 of which is funnel shaped so that the neck of a kinescope easily enters the bore irrespective of the alignment at the kinescope neck and the bore. A cylindrical portion 28 of the bore is dimensioned to closely receive the flare of the kinescope neck so that the neck can be centered in the apparatus by centering the floating positioner 26. However, the kinescope neck enters the cylindrical portion 28 without regard to the alignment of the neck and positioner bore because the positioner 26 horizontally floats in the aperture 13. As shown in FIGS. 1 and 3, the positioner 26 is fixed to a plate 29. Two alignment cones 31 and 32 extend downwardly from the bottom of the plate 29. Affixed to the bottom side of the plate 29 are four bearings 33, 34, 35, and 36 which respectively support four rods 37, 38, 39, and 40. The four rods 37 to 40 extend downwardly to the bottom of the apparatus and the bottom ends of the rods also are supported by bearings, two of which, 41 and 42, are shown in FIG. 1. The bearings at both ends of the rods 37 to 40 permit the rods to pivot in any direction and the positioner 26 is free to float in all directions in the plane of the aperture 13. Accordingly, when a kinescope is placed upon the supports 18 and 19 the neck of the kinescope acts against the side of the funnel portion 27 of the bore and the floating action of the positioner allows the positioner to move so that the neck enters the cylindrical portion 28 of the bore irrespective of the alignment of the kinescope neck and the positioner 26.

A cylinder 43 is pivotably affixed to the side of the frame 11. The shaft 46 of the cylinder 43 is pivotly connected to a cross bar 47. As shown in FIG. 3, the cross bar 47 is fixedly attached to two arms 48 and 49. One end of the arms 48 and 49 is attached to a shaft 51. The shaft 51 is pivotly received by two bearings 53 and 54, both of which also are attached to the sides of the frame 11. The arms 48 and 49 therefore can be simultaneously rotated downwardly and upwardly by causing the shaft 46 to move into and out of the cylinder 43. Integral with the arms 48 and 49, respectively, are centering brackets 56 and 57. The brackets 56 and 57 respectively include apertures 58 and 59 having diameters which are substantially equal to the diameters of the bases of the cones 31 and 32.

When a kinescope is initially placed upon the apparatus 10, the shaft 46 of the cylinder 43 is in the retracted position and the centering brackets 56 and 57 are rotated downwardly away from the alignment cones 31 and 32. The kinescope 14 is loosely positioned close to the center of the aparatus because of the action of the angularly disposed supports 21 to 24 on the funnel of the kinescope. The flared end of the kinescope neck enters the cylindrical portion 28 of the positioner bore irrespective of the alignment of the neck and the positioner 26 because the floating nature of the positioner. The shaft 46 of the cylinder 43 is then moved outwardly thereby rotating the brackets 56 and 57 upwardly toward the cones 31 and 32. The apertures 58 and 59 within the brackets 56 and 57 respectively engage the alignment cones 31 and 32 and center the cones in the apertures. The floating positioner 26, and therefore the kinescope neck, is thus accurately located at the desired position within the apparatus and is maintained in such position by keeping the shaft 46 in the extended position.

As shown in FIGS. 1 and 2 a slide 61 is arranged to vertically slide on two columns 62 and 63. A pulley 64 is arranged on a shaft 66 which is rotatably supported between the columns 62 and 63. A flexible cord, or chain, 67 is connected to the slide 61 and passes over the pulley 64 to a reel 103. The reel 103 is actuated by a motor, or other appropriate type of device, to raise and lower the slide 61. The columns 62 and 63 are fixedly coupled to the base 11 by mounting brackets 68 and 69. Accordingly, the slide 61 can move upwardly and downwardly with respect to the stationary frame 11 and the components affixed thereto. A mounting plate 71 is affixed to the slide 61 and thus moves upwardly and downwardly along with the slide. Four L-shaped brackets 72, 73, 74, and 75 are supported above the mounting plate 71 by a plurality of supports 86, 87, 88 and 89. The L-shaped brackets 72 to 75, respectively, include orientation bumpers 76, 77, 78, and 79. Integral with the L-shaped brackets 72, 73, 74 and 75, respectively, are actuating members 81, 82, 83 and 84 which are angularly disposed with respect to the brackets. The actuating members 81 to 84 are slideably held by the supports 86 to 89 and the L-shaped brackets 72 to 75 are moveable inwardly toward and outwardly away from the kinescope 14. In the preferred embodiment shown, the actuating members 81 to 84 are elongated racks which are driven by gears 91 to 94.

As shown in FIG. 1, an actuating device 96, such as an accurate stepping motor or fluid device, is fixed to the slide 61 by a mounting bracket 90. The motor shaft 97 rotates a pulley 98 and the gear 94. Another pulley 99 is identical to the pulley 98 and is supported by the mounting bracket 86 to rotate the gear 91. Similar pulleys (not shown) are used to rotate the gears 92 and 93. A drive belt 101 is arranged around the four pulleys so that energization of the motor 96 rotates the four gears 91 to 94 at the same rate. The racks 81 to 84 thus move inwardly and outwardly with respect to the kinescope 14, depending upon the direction of rotation of the motor 96. Because of the angular disposition of the racks 81 to 84 with respect to the L-shaped brackets 72 to 75, the orientation of the brackets with respect to the kinescope 14 remains constant during such movement.

As shown in FIG. 1, the L-shaped bracket 75 is higher than the L-shaped bracket 72 and accordingly is capable of passing over the bracket 72 during inward motion of the brackets. Diagonally located brackets 73 and 75 are at one height and diagonally located brackets 72 and 74 are at a lower height. Accordingly, during inward motion the brackets 73 and 75 move above the brackets 72 and 74. Kinescopes of all sizes therefore can be checked using the same L-shaped brackets because the amount of travel is determined by the size of the kinescope rather than by the size of the brackets. Orientation bumpers 76, 77, 78, and 79 move along with the L-shaped brackets 72, 73, 74, and 75 respectively, and engage the sides of the kinescope 14 to rotate the kinescope into alignment with the brackets 72 to 75. An electrical contact which is suspended from the brackets thus comes into contact with all sides of the kinescope.

Figure 4:
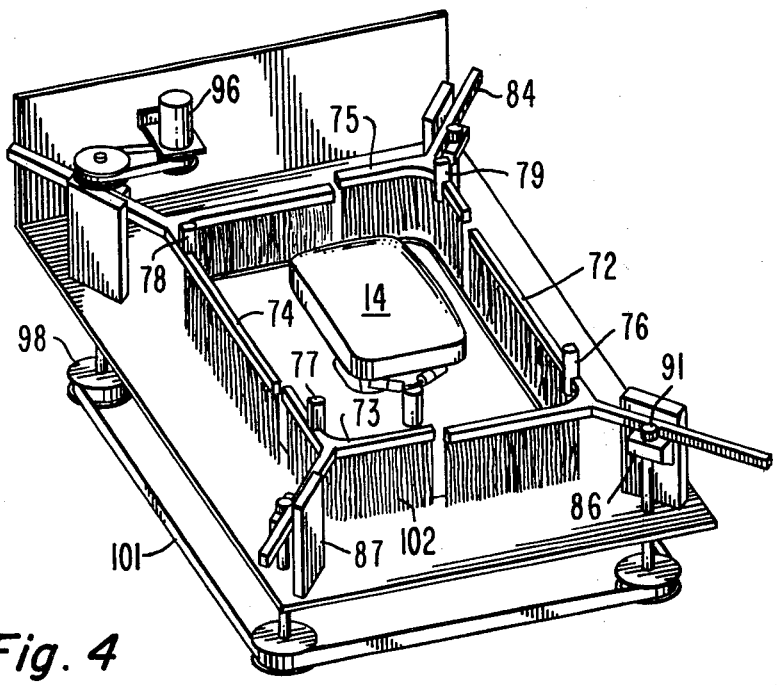
FIG. 4 shows a kinescope loosely positioned in the general vicinity of a particular location within the apparatus.

As shown in FIGS. 1 and 4, a drape-like flexible electrical contact 102 is suspended from the L-shaped brackets 72 to 75. The electrical contact 102 is divided into segments and each segment is suspended from one of the L-shaped brackets. The contact is used to establish electrical contact between the frit seal of the kinescope and another probe (described hereinafter) which is inserted into the kinescope neck. Accordingly, the contact 102 must touch a substantial portion of the frit seal. For this reason, the contact is made to exhibit the characteristics of a fluid so that it "flows" over the sides of the kinescope irrespective of the configuration and size of the kinescope. Bead chains exhibit such characteristics and thus, in the preferred embodiment, the contact 102 is composed of a large number of bead chains which are suspended side-by-side from the L-shaped brackets.

Initially the kinescope 14 is placed upon the supports 18 and 19 and is loosely positioned in the vicinity of the center of the apparatus. The neck of the kinescope 14 first enters the funnel portion 27 of the floating positioner 26 and ultimately the flared end of the neck is closely received by the cyclindrical portion 28 or the bore 25. However, because the positioner 26 floats, the positioner moves into alignment with the neck and the kinescope remains positioned in the vicinity of the center of the apparatus. Accordingly, kinescopes can be easily inserted into the apparatus either manually or automatically without attempting to align the kinescope neck with the positioner. After the kinescope neck enters the funnel 27, the cylinder 43 is actuated to move the shaft 46 upwardly and rotate the plates 56 and 57 toward the alignment cones 31 and 32. The apertures 58 and 59 respectively engage the alignment cones 31 and 32 to firmly and permanently position the floating positioner 26 in the center of the apparatus. The centering of the positioner 26 also centers the neck of the kinescope because of the close fit of the neck flare and the cylindrical bore portion 28.

Figure 5:
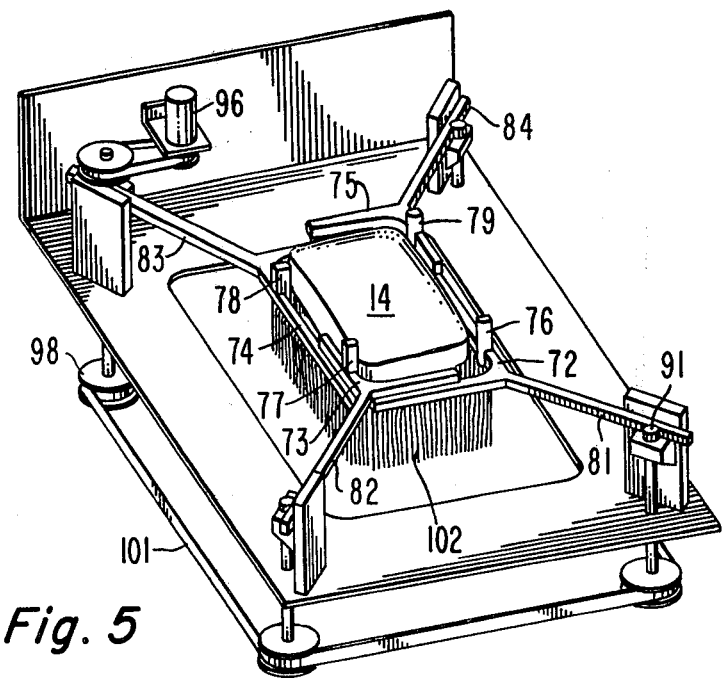
FIG. 5 shows the accurate positioning of a kinescope with respect to a particular location within the apparatus.
Figure 6:
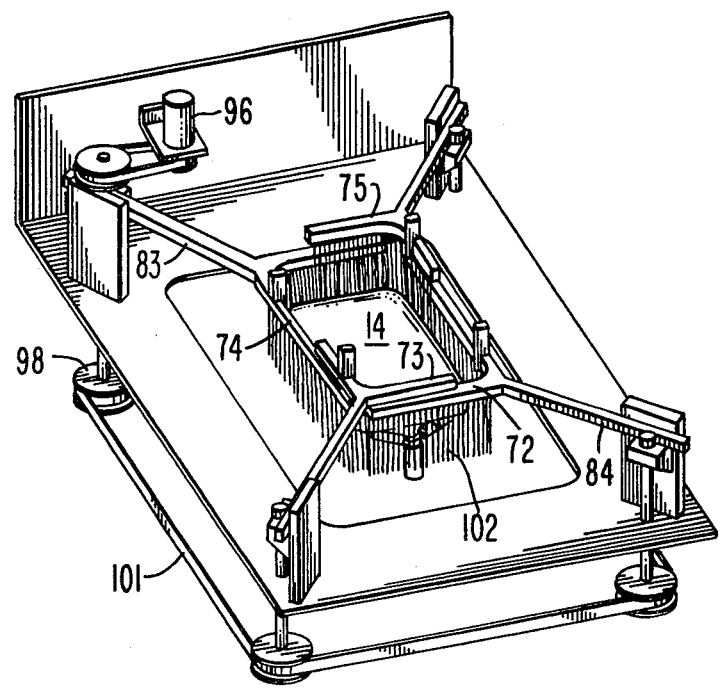
FIG. 6 shows how the drape-like electrical contact touches a substantial portion of the frit seam of the kinescope.

As shown in FIG. 5, upon actuation of the stepping motor 96, the racks 81 to 84 move the L-shaped brackets 72 to 75 inwardly toward the kinescope 14. Because of the angular disposition of the racks and the brackets, the orientation of the brackets with respect to the kinescope is maintained. The orientation bumpers 76, 77, 78 and 79 engage the sides of the kinescope, and because the kinescope is loosely held by the supports 18 and 19, the funnel portion of the kinescope is rotated so that the sides of the kinescope are parallel to the sides of the L-shaped brackets. This rotation helps assure that the fluid-like contact 102 engages a substantial portion of the frit seal. After the funnel orientation is completed, the L-shaped brackets are raised upwardly and segments of the fluid-like contact 102 touch the entire, or a very substantial portion of, the kinescope frit seal. Electrical contact between the bead chain 102 and the frit seal is thus established. The raising of the bead chain contact 102 is accomplished by actuating a motor to rotate the reel 103 and move the slide 61 and the mounting plate 71 upwardly on the columns 62 and 63.

As shown in FIG. 1, a probe 104 having a movable electrical contact 106 is supported on a vertical shaft 105 by a slide 107 and a bracket 108 at the center of the apparatus. The probe is permanently arranged along the center of the apparatus and is movable vertically to enter the neck of the kinescope as the slide 107 moves along the shaft 105. The height of insertion of the probe 104 into the kinescope is such that the movable contact 106 enters the funnel portion of the kinescope. An electro-magnet 109 is supported above the aperture 13 in the vicinity of the funnel portion of the kinescope. After the probe 104 is inserted into the neck to the full height, the magnet 109 is energized and attracts the bead chain against a conductive coating on the inside of the kinescope. Electrical contact between the probe and the inside of the kinescope is thereby established. The single bead chain contact 106 and the fluid-like multibead chain contact 102 are electrically energized with appropriate electrical circuitry, which is within the purview of one skilled in the art so that one of the contacts receives a high voltage and the other is grounded. Upon the application of the high voltage an electrical breakdown of the frit seal is indicated by a current flow through the circuitry which connects the two probes.

The probe 104 can be of the type described in Patent Application Ser. No. 170,815 filed July 21, 1980 by Gerald M. Allardyce, Ronald N. Moskalczak and Edward A. Gronka and entitled, "Method of Checking for Electrical Frit Breakdown in Kinescopes and Apparatus Therefore" now Pat. No. 4,329,648. Additionally, if desired the probe 104 can be made hollow and used to pass flushing air into the funnel.

What is claimed is:

1. An apparatus for checking for electrical breakdown of the frit seal between the funnel and the screen of a kinescope envelope having an internal conductive coating in said funnel and in a neck affixed to said funnel comprising:

means for loosely supporting said kinescope envelope in the vicinity of a particular location of said apparatus;
   floating positioning means for closely receiving said neck when said kinescope envelope is positioned in said vicinity;
   means for orientating said funnel in a selected orientation with respect to said apparatus, said means for orientating including a plurality of brackets arranged for simultaneous movement toward the sides of said kinescope envelope, each of said brackets including at least one bumper for rotating said kinescope envelope toward said selected orientation;
   means for positioning and securely maintaining said floating positioning means and said kinescope envelope in said particular location;
   drape-like electrical contact means suspended from said means for orientating for movement against a substantial portion of said frit seal to establish electrical continuity between said frit seal and said drape-like contact;
   probe means, including a movable electrical contact, arranged for insertion into said funnel portion through said neck portion;
   and means for moving said movable electrical contact against said conductive coating.

2. The apparatus of claim 1 wherein said drape-like contact means includes a plurality of flexible conductive elements suspended from said brackets.

3. The apparatus of claim 3 wherein said flexible conductive elements are bead chains closely spaced along said brackets.

4. The apparatus of claim 3 wherein there are four of said brackets arranged for movement along the diagonals of a rectangle to accommodate kinescope envelopes of varying sizes, and wherein adjacent brackets are arranged in spaced planes whereby adjacent brackets can overlap.

5. The apparatus of claim 1 or 4 wherein said floating positioning means includes a bored member having a longitudinal bore, said bore having a conical portion for guiding said neck portion into said bored member and a cylindrical portion for closely receiving said neck portion to position said neck portion in said location.

6. The apparatus of claim 5 wherein said means for securely maintaining includes a bracket coupled to said bored member, at least one centering cone affixed to said bracket, and a moveable arm including at least one aperutre positioned in the proximity of said bracket, whereby said aperture engages said cone to accurately position and securely maintain said neck portion in said particular location.

7. The apparatus of claim 6 further including a plurality of elongated supports pivotably coupled to said bracket at one end and pivotably coupled to a ground plane at the other end.

8. The apparatus of claim 7 wherein said movable electrical contact is a bead chain and wherein said means for moving said contact is an electromagnet.

9. A method for checking for electrical breakdown of the frit seal of a kinescope envelope including the step of:

bringing an electrical contact composed of a plurality of bead chains into contact with a substantial portion of said frit seal.

10. The method of claim 9 further including the step of dividing said contact into a plurality of segments.

11. The method of claim 10 further including the step of suspending said segments from a plurality of L-shaped brackets.

12. An apparatus for determining electrical continuity between the outside of the frit seal of a kinescope envelope and a conductive coating on the inside of said kinescope envelope comprising:

an electrical contact composed of a plurality of bead chains;
   support means for holding said kinescope envelope;
   means for moving said contact and said kinescope envelope relative to one another to bring said contact against a substantial portion of said frit seal; and
   means for electrically contacting said conductive coating.

* * * * *